United States Patent
Schabel

(12) 
(10) Patent No.: US 7,855,582 B2
(45) Date of Patent: Dec. 21, 2010

(54) DEVICE AND METHOD FOR DETECTING A TIMING OF AN EDGE OF A SIGNAL WITH RESPECT TO A PREDEFINED EDGE OF A PERIODIC SIGNAL

(75) Inventor: Stefan Schabel, Syrgenstein (DE)

(73) Assignee: Atmel Automotive GmbH, Heilbronn (DE)

( * ) Notice: Subject to any disclaimer, the term of this patent is extended or adjusted under 35 U.S.C. 154(b) by 47 days.

(21) Appl. No.: 12/102,845

(22) Filed: Apr. 14, 2008

(65) Prior Publication Data

US 2008/0252347 A1 Oct. 16, 2008

Related U.S. Application Data

(60) Provisional application No. 60/907,660, filed on Apr. 12, 2007.

(30) Foreign Application Priority Data

May 10, 2007 (DE) ........................ 10 2007 022 432

(51) Int. Cl.
*H03K 5/22* (2006.01)
(52) U.S. Cl. .................. 327/24; 327/147; 327/156; 327/161; 327/175
(58) Field of Classification Search .................. 327/24, 327/175

See application file for complete search history.

(56) References Cited

U.S. PATENT DOCUMENTS

| 5,838,754 | A | 11/1998 | Gorbics et al. |
| 6,486,716 | B1 * | 11/2002 | Minami et al. ............... 327/152 |
| 6,741,109 | B1 * | 5/2004 | Huang et al. ................. 327/156 |
| 2003/0006750 | A1 | 1/2003 | Roberts et al. |
| 2003/0076181 | A1 | 4/2003 | Tabatabaei et al. |

* cited by examiner

*Primary Examiner*—Lincoln Donovan
*Assistant Examiner*—John W Poos
(74) *Attorney, Agent, or Firm*—Muncy, Geissler, Olds & Lowe, PLLC

(57) ABSTRACT

A device and method for detecting timing of an edge of a signal with respect to a timing of a predefined edge of a periodic signal is provided, wherein the edge defines a state change between a first state and a second state of the signal, and wherein the device can include: a phase-shift element to shift the phase of the signal relative to the phase of the periodic signal by a phase shift value at which the state change can be sensed at a point in time determined by the timing of the predefined edge; and a detection element to detect the timing of the edge relative to the timing of the predefined edge on the basis of the phase shift value. The phase-shift element can be an adjustable delay element for delaying the signal by an adjustable delay value as a phase shift value.

8 Claims, 2 Drawing Sheets

DEVICE AND METHOD FOR DETECTING A TIMING OF AN EDGE OF A SIGNAL WITH RESPECT TO A PREDEFINED EDGE OF A PERIODIC SIGNAL

This nonprovisional application claims priority to German Patent Application No. DE 10 2007 022 432.1, which was filed in Germany on May 10, 2007, and to U.S. Provisional Application No. 60/907,660, which was filed on Apr. 12, 2007, and which are both herein incorporated by reference.

BACKGROUND OF THE INVENTION

1. Field of the Invention

In digital circuits, it is oftentimes necessary to determine the timing of the edges of different signals relative to one another. If a pulse is generated with an edge that must have a predefined timing, which is to say a predetermined time relationship (for example, a delay) relative to a rising or falling edge of a clock signal, then it is important to verify whether the edge of the pulse actually has this predefined timing.

2. Description of the Background Art

Known from US 2003/0006750 A1 is a measurement component for time measurement with a Vernier delay line (VDL). To this end, two delay lines having different fixed delay times are provided, each of which is fed back to produce an oscillator. As a result of slightly differing frequencies of the two oscillators, a time difference between an edge of a data signal and an edge of a clock signal can be measured using a count of the oscillations. Process-related differences in the delay elements can be eliminated with the production of identical delay elements in each stage.

SUMMARY OF THE INVENTION

It is therefore an object of the invention to provide a device whose detection of a timing of an edge of a signal with respect to a timing of a predefined edge of a periodic signal is as insensitive as possible to process variations.

An aspect of the invention is based on the knowledge that the timing of the edge of the signal with respect to the timing of the periodic signal serving. as reference can be implemented through a phase shift by a phase shift value for which a change in the state of the signal, for example from a high signal level ("high") to a low signal level ("low"), or vice versa, can be detected at a point in time determined by the timing of the edge of the periodic signal.

For example, if the periodic signal is a clock signal with a clock rate in the range from, e.g., 300 to 600 MHz or up to 800 MHz, then, for example, at a detection time point at the rising or falling edge of the clock signal it is possible to detect whether the state of the signal, which can be, e.g., a pulse signal that can be periodic, or can be a step-function signal, has changed in comparison to a state of the signal detected at a previous detection point in time. For example, if different states of the signal were detected at the previous and current detection points in time, then a state change is present, and the phase of the edge of the signal has shifted in the direction of the phase of the predefined edge of the periodic signal to such a degree that, based on the phase shift value and, if applicable, the phase of the periodic signal, which can be taken as a reference value, a conclusion can be drawn concerning the original phase of the edge relative to the phase of the predefined edge, and thus concerning the timing of the edge with respect to the timing of the predefined edge.

In contrast, if no state change is detectable at the present detection point in time defined by the timing of the predefined edge, then the phase of the signal is shifted, for example in a number of phase shift steps, each with a predefined phase shift value (e.g., 1 degree or 2 degrees or 10 ps or 20 ps or 30 ps) until the state change is detectable at the point in time determined by the predefined edge of the periodic signal. The timing of the edge can be directly inferred on the basis of the total phase shift.

The invention creates a device for detecting a timing of an edge of a signal, for example a pulse signal or a step-function signal or a periodic pulse signal, relative to a timing of a predefined edge, for example a rising or falling edge, of a periodic signal that can be a periodic clock signal. The periodic clock signal preferably serves as a high-precision time reference in this regard. The clock signal is advantageously derived from the oscillations of a quartz crystal. The device advantageously has an input to receive the periodic signal. Here, the edge of the signal defines a state change between a first state and a second state of the signal. The signals here are preferably of such a nature that a difference of the timing of the edge and the predefined edge is less than the period of the periodic signal, and is, for example, a fraction thereof.

Preferably, the device includes a phase-shift element to shift the phase of the signal relative to the phase of the periodic signal by a phase shift value at which the state change can be sensed (detected) at a point in time determined by the timing of the predefined edge. In other words, the phase shift element rotates the phase of the signal in the direction of the phase of the periodic signal until the state change is detectable, for example with the predefined edge. The phase shift element is a delay element that is adjustable with regard to a delay value. The delay element is designed to delay the signal by an adjustable delay value. The delay value here is changed by adjustment. The delay value here constitutes the phase shift value.

The device further includes a detection element to detect the timing of the edge relative to the timing of the predefined edge on the basis of the phase shift value. Since the phase shift value specifies the phase value by which the phase of the signal must be shifted until the state change occurs, the detection element can determine the timing of the edge directly from the phase shift value, for example. For when the state change is present at the point in time at which the predefined edge occurs, it can be assumed that the phases of the edges match to within a degree of precision that is determined, for example, by a smallest phase shift value.

According to a further embodiment, the delay element has means for adjusting the delay value by controlling it in discrete steps. In this regard, the phase shift value is a total phase shift value that is made up of a number of discrete phase shift values. The phase rotation in the discrete steps is preferably iterative.

In advantageous embodiment of this further development, the delay element has switchable capacitors as its means. The capacitors are preferably integrated capacitors such as MIM capacitors or MOS capacitors. Alternatively, the capacitors are gate capacitors of MOS field-effect transistors. For example, the field-effect transistors can make up the delay element as cascaded inverters: In addition, as its means for adjustment the delay element also has switches, in particular switching transistors, which are connected for switching different capacitor values to adjust the delay value.

In another embodiment, the delay element is designed as a phase-shift element in order to shift the phase of the signal in a number of discrete steps, each of which has a predefined delay value per step as the phase shift value, until the state change can be detected at a point in time defined by the timing of the predefined edge of the periodic signal.

The delay can be implemented in steps of 20 ps, for example. The phase shift element is therefore an adjustable digital or analog delay element for delaying the signal by a delay value. For example, the detection element can detect the timing of the edge relative to the timing of the predefined edge by difference determination on the basis of the (total) delay value at which the state change occurs, and if applicable on the basis of the period of the periodic signal.

According to an embodiment, the phase shift element is designed to shift the phase of the signal in a number of phase shift steps, each of which has a predefined (relative or absolute) phase shift value per phase shift step, e.g., 1 degree, 2 degrees, 5 degrees, 10 degrees, or 10 ps, or 15 ps, or 20 ps. For example, the phase shift element can increase or decrease the phase of the signal by a further phase shift value in an additional phase shift step in the event that, at the present phase of the signal, no state change is detectable at a point in time determined by the predefined edge. This iteration can be carried out until the state change is detectable at a point determined by the predefined edge, which can be located in another period of the periodic signal, for example.

According to another embodiment, the device has a control element that can be designed to adjust the delay value of the delay of the delay element by a predefined delay value. The control element is designed to change the delay value as a function of an output signal of the detection element, in particular in the case that the output signal of the detection element indicates that no state change is present.

In an embodiment, the control element can be designed to determine and output the delay value on the basis of the controlled discrete steps as the detected timing of the edge of the signal relative to the timing of the predefined edge of the periodic signal.

According to another embodiment, the device has a timer that can be integrated on a semiconductor chip together with the delay element. In response to a control signal from the control element, the timer outputs a timer signal (as the signal) having a timer signal edge (as the signal edge). This defines the state change between a first and a second state of the timer signal.

The control element can be designed to repeat the control signal and to change the delay value with each repetition until a phase zero-crossing can be detected by the detection element as a termination condition.

In an embodiment, the device has an analysis element. The analysis element can be designed to detect the characteristic of the timer on the basis of a series of delay values as a function of timings. The analysis element is preferably designed to perform an analysis of a series of phase shift values as a function of timings, in order to determine, e.g., whether the series is monotonically decreasing or monotonically increasing.

According to another embodiment, the device can be further designed to detect a timing of an additional edge of an additional signal relative to a timing of a predefined edge of the periodic signal, wherein the additional edge defines a state change between a first state and a second state of the additional signal, wherein the phase shift element is designed to shift the phase of the additional signal relative to the phase of the periodic signal by an additional phase shift value at which the state change can be detected at a point in time determined by the timing of the predefined edge of the periodic signal, and wherein the detection element is designed to determine the timing of the edge of the additional signal relative to the timing of the predefined edge on the basis of an additional phase shift value.

According to another embodiment, the detection element can be connected after the phase shift element Preferably, the control element can be connected after the detection element and receives the latter's output signals. The control element is preferably designed to increase the phase shift of the phase shift element by a predefined phase shift value, e.g., 1 degree, 2 degrees or 5 degrees, or 10 ps, or 15 ps, or 20 ps, if an output signal of the detection element indicates that no state change is present.

According to another aspect, the invention creates a measurement system for detecting a characteristic of a timer that, in response to a control signal indicating a timing of an edge relative to a timing of a predefined edge of a periodic signal, outputs a timer signal having a timer signal edge that defines a state change between a first and a second state of the timer signal. According to one aspect, the timer itself is not a part of the measurement system. According to another aspect, the timer is a part of the measurement system and is, for example, located therewith on a chip. The measurement system is preferably provided to detect or monitor the characteristic of the timer.

The measurement system includes a control element for providing or generating a first control signal and a second control signal, wherein the first control signal indicates a first edge with a first timing relative to a timing of a predefined edge of a periodic signal and wherein the second control signal indicates a second edge with a second timing relative to a timing of a predefined edge of the periodic-signal. If the two signals are successively routed to the timer that is to be measured, the latter responds to each by generating a timer signal with at least one timer edge.

The measurement system additionally includes the above-described device for detecting a timing of an edge whose phase-shift element can be designed to shift the phase of a first timer signal with a first timer signal edge relative to the phase of the periodic signal by a first phase shift value at which the state change can be detected at a point in time determined by the timing of the predefined edge. The phase-shift element is additionally designed to shift the phase of a second timer signal with a second timer signal edge relative to the phase of the periodic signal by a second phase shift value at which the state change can be detected at a point in time determined by the timing of the predefined edge. The detection element is additionally designed to determine the timing of the first timer signal edge on the basis of the first phase shift value, and the timing of the second timer signal edge on the basis of the second phase shift value.

The measurement system also includes an analysis element to detect the characteristic on the basis of a series of phase shift values as a function of timings. If the phase shift is implemented by a time delay, the analysis element detects the characteristic on the basis of time delay values and (optionally) on the basis of the period of the periodic signal.

According to a further embodiment, the analysis element can be designed to determine whether the series of phase shift values is monotonic as a function of timings. If the series is monotonic, and preferably linear, it can be concluded therefrom that the timer functions correctly.

Moreover, the measurement system can have an interface to which the timer can be connected. This interface can be designed to provide the aforementioned control signals for the timer and/or to receive the timer signals.

According to another aspect, the invention produces a method for detecting a timing of an edge of a signal relative to a timing of a predefined edge of a periodic signal, wherein the edge defines a state change between a first state and a second state of the signal. The method preferably includes the shifting of the phase of the signal relative to the phase of the periodic signal by a phase shift value through adjustment of a delay value of a delay element. The state change can be detected at a point in time determined by the timing of the predefined edge.

According to another embodiment, the method includes the detection of the timing of the edge relative to the timing of the predefined edge on the basis of the delay value as the phase shift value.

According to an advantageous further development, provision is made to repeatedly change the phase of the signal until a phase zero-crossing can be detected as a termination condition, preferably by a detection element.

According to another aspect, the invention produces a measurement method for detecting a characteristic of a timer that, in response to a control signal indicating a timing of an edge relative to a timing of a predefined edge of a periodic signal, outputs a timer signal having a timer signal edge that defines a state change between a first and a second state of the timer signal. The measurement method preferably includes the provision or generation of a first control signal and a second control signal, wherein the first control signal indicates a first edge with a first timing relative to a timing of a predefined edge of a periodic signal, and wherein the second control signal indicates a second edge with a second timing relative to a timing of a predefined edge of the periodic signal. The measurement method can also include the step of driving the timer in order to provide it with the control signals.

The measurement method further includes the steps of the inventive method for detecting a timing of an edge, wherein during the step of shifting, the phase of a first timer signal with a first timer signal edge is delayed relative to the phase of the periodic signal by a first phase shift value for which the state change can be detected at a point in time determined by the timing of the predefined edge, and wherein additionally, during the step of shifting, the phase of a second timer signal with a second timer signal edge is delayed relative to the phase of the periodic signal by a second phase shift value for which the state change can be detected at a point in time determined by the timing of the predefined edge, wherein in the step of detection the timing of the first timer signal edge is determined on the basis of the first phase shift value and the timing of the second timer signal edge is determined on the basis of the second phase shift value.

The measurement method further includes the step of detecting the characteristic on the basis of a series of phase shift values as a function of timings. If the phase shift is implemented by time delay, the measurement method includes the step of detecting the characteristic on the basis of the series of time delay values as a function of timings.

Additional steps of the inventive method result directly from the respective functionality of the respective device.

According to another aspect, the invention produces a computer program for carrying out at least one of the above-described methods when the program runs on a computer. According to another aspect, the invention produces a programmed device designed to execute the computer program.

Another aspect of the invention is the use of an adjustable delay element integrated on a semiconductor chip together with a timer to detect a characteristic of the timer. The delay element is designed to delay a signal by an adjustable delay value. In response to a control signal, the timer outputs a timer signal having a timer signal edge that defines a state change between a first and a second state of the timer signal.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
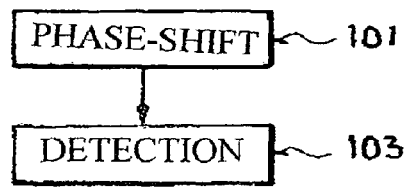
FIG. 1 is a block diagram of a device for detecting an edge.

FIG. 1 shows a block diagram of a device for detecting a timing of an edge of a signal relative to a timing of a predefined edge of a periodic signal. The device includes a phase-shift element 101 to shift the phase of the signal relative to the phase of the periodic signal by a (total) phase shift value at which the state change can be detected at a point in time determined by the timing of the predefined edge (second timing). The phase-shift element 101 is a delay element that, e.g., iteratively delays the signal in a number of delay steps having a delay value of, e.g., 20 ps, until a state change between signal states can be detected, for example by a threshold detector.

The device also contains a detection element 103 to detect the timing of an edge relative to the trimming of the predefined edge on the basis of the phase shift value. If the phase of the periodic signal is taken as a reference quantity, the detection element 103 can determine the timing of the edge directly from the phase shift and the specified clock rate.

An advantage of the example embodiment shown in FIG. 1 can be that the timing of the edge of the signal can be determined even when the period of the clock signal is longer than the difference in the timing of the edge and the predefined edge. Thus, for example, when determining the timings of signal edges by measurement, it is possible to avoid the use of expensive oscillators with high clock rates, which would otherwise be necessary to determine such small time differences.

Another advantage of this example embodiment is that the measurement of, for example, the timings of signal edges can take place directly on a chip, and need not be carried out through measurement cards or testers. Signal distortions or propagation time shifts are also reduced in this way. Moreover, external test hardware such as, e.g., high-speed samplers or oscilloscopes, does not necessarily have to be used. Thus, no high-frequency measurements are necessary outside the chip, either. The measured values can, for example, be read out at low speed through a serial or parallel interface after the measurement is complete, and the measurement times are short. The signal processing elements, control elements, or detection elements can operate with a slow clock, which is, e.g., provided by the periodic signal, because the critical signal path passes through a delay element as phase-shift element 101.

Figure 2:
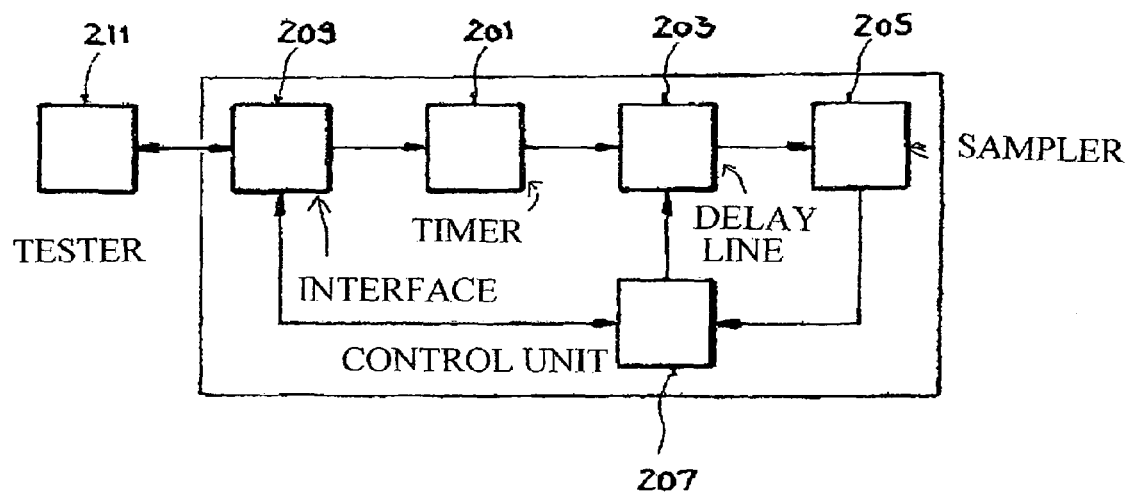
FIG. 2 is a block diagram of a measurement system.

FIG. 2 shows a block diagram of a measurement system for detecting a characteristic of a timer 201. The measurement system includes a delay unit 203 (delay element) that follows a sampling element 205 (detection element. An output of the sensing element 205 is connected to an input of a control unit 207 (control element), wherein an output of the control unit 207 is connected to an input of the delay unit 203. Another input of the delay unit 203 is or can be connected to an output of the timer 201. The measurement system also includes an interface 209, whose output is connected to an input of the timer 201. A terminal of the interface 209 is also connected to another terminal of the control unit 203. Another terminal of the interface 209 is connected to a tester 211, which can be an external tester or a part of the measurement system.

The measurement system is used to measure the (existing) timer 201, whose output pulse is generated as adjustable fractions 1/k of the period of a system clock, and to determine whether the time resolution of the timer behaves in a linear or monotonic fashion. The delay unit 203, which is preferably adjustable, is additionally employed for this purpose, for example on a chip. Also provided are the sensing element 205 and the control unit 207.

The timer 201, whose output pulse (or the timing of the output pulse) can be set in fractions 1/k of the system clock period T (clk), where k is a natural number, represents the circuit to be measured. The delay unit 203 preferably has a monotonic characteristic, wherein its delay is preferably adjustable with a precision of a few picoseconds. The delay unit 203 can, for example, be a delay line of monotonic design adjustable in 10 ps, 15 ps or 20 ps, which is driven by the control unit 207, which in turn can communicate with the connected tester 211 (e.g., through the serial or parallel interface 209). The output of the delay unit 203 is connected to a sampler 205 that is clocked by the system clock. The sampling element 205 is provided to sample the output signal of the delay unit 203 at the system clock.

An output pulse of the timer 201, the timing of which can be set in fractions of the system period, is routed through the delay unit 203. The control unit 207 searches for the setting (delay value) of the delay unit 203 that shifts the phase of the output pulse of the timer 201 back to the clock of the sampler 205. In this process, different settings of the timer 201 result in different identified delays. These results can be used to evaluate the monotonic/linear characteristic curve of the timer 201.

This achieves the result that the critical signal path need not be routed on the chip through a measurement card or a tester in order to measure the characteristic of the timer 201. Moreover, no additional, external hardware is necessary. The measurement times are short, and high-frequency measurements can be avoided. The calculation of the characteristic curve of the timer and/or the determination of whether the time resolution is monotonic or linear can be determined with the aid of test software when run on a computer.

Figure 3:
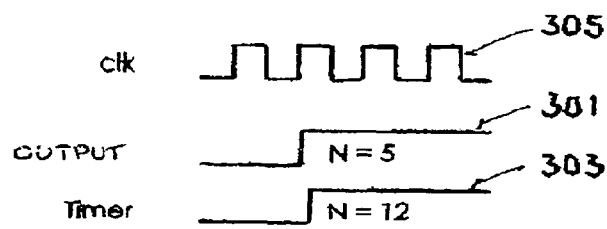
FIG. 3 is a signal timing diagram.

By way of example, FIG. 3 shows timings of a timer output signal 301 for N=5, and of a timer output signal 303 for N=12, relative to a clock signal 305 (clk) with k=40.

For purposes of measurement, the timer 201, whose output pulse is, e.g., periodic, and is, e.g., routed through the adjustable delay line 203, is set to 1/40 (approximately 9 degrees), for example. The delay line 203 is implemented such that it is adjustable with a step size of approximately 20 ps and has monotonic behavior, which can be implemented, for example, by switching in an additional capacitor for each digital setting (delay value), wherein larger digital values result in larger delays.

The output of the delay line is taken up by the sampler 205, which operates at the system clock, wherein in the static case either a continuous high or low level is detected depending on the setting of the timer 201 and the delay line 203. The digital delay value D(i), where i designates the step index, starts at zero (i=1), at which point the value sampled by the sampler 205 is stored.

The digital delay value D(i) for the delay unit 203 is increased, for example by one step at a time, until the sampled value is, e.g., "low" and the previously stored value was "high," in other words until a state change occurs. The digital delay value of the delay unit 203 is read out from the tester 211.

The timer 201 is now set to, e.g., 2/40 (N=2, k=40) (approximately 18 degrees) and the above steps are repeated. Here, for example, the digital delay value D(2) of the digital delay unit 203 is read out. Since the timer 201 must have changed by 1/40 in the positive direction relative to D(1), the delay must be smaller for the delayed output pulse to overlap with the sampling clock. D(2) must therefore be smaller than D(1) (differential nonlinearity). In this way, the entire value range of the timer 201 can be set and measured. The evaluation and analysis can be carried out by means of tester software running on a computer. This process tests, in particular, whether the timer characteristic is monotonic and linear, in order to recognize defective components in case the timer characteristic is not monotonic and/or is nonlinear.

Figure 4A:
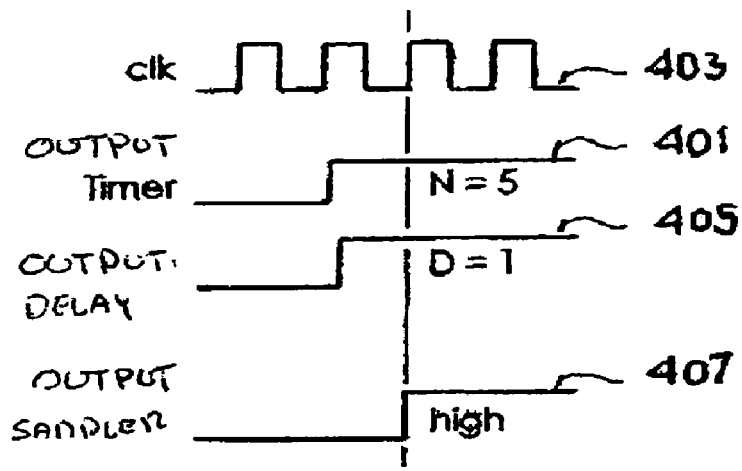
FIGS. 4a to 4c are signal timing diagrams.
Figure 4B:
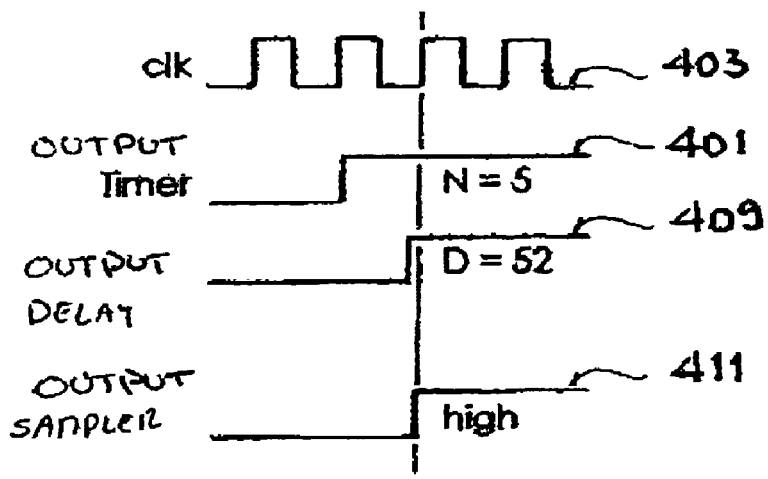
Figure 4C:
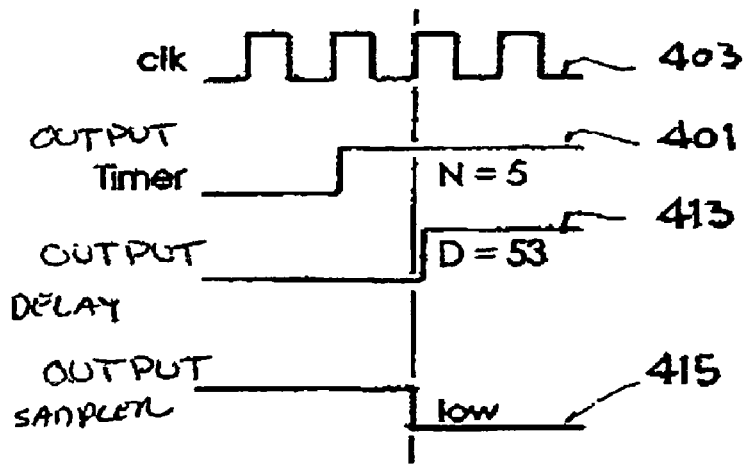

FIGS. 4a, 4b, and 4c show additional signal timing diagrams with timer output signals 401, clock signals 403, an output signal 405 from the delay unit 203 for D(1) and an output signal 407 of the sampler 205, an output signal 409 from the delay unit 203 for D(53) and an output signal 411 of the sampler 205, and an output signal 413 from the delay unit 203 for D(53) and an output signal 415 of the sampler 205.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A device for detecting a timing of an edge of an input signal with respect to a timing of a predefined edge of a periodic signal, the edge of the input signal defining a state change between a first state and a second state of the input signal, the device comprising:

a phase-shift element for shifting a phase of the input signal relative to a phase of the periodic signal by a phase shift value, wherein the state change is sensed at a point in time determined by the timing of the predefined edge; and a detection element for detecting the timing of the edge of the input signal relative to the timing of the predefined edge based on the phase shift value, wherein the phase-shift element is an adjustable digital delay element for delaying the input signal by an adjustable delay value as the phase shift value, wherein the delay element adjusts the delay value by controlling the delay value in discrete steps, and wherein the delay element has a switchable capacitor for adjusting the delay value.

2. A device for detecting a timing of an edge of an input signal with respect to a timing of a predefined edge of a periodic signal, the edge of the input signal defining a state change between a first state and a second state of the input signal, the device comprising:

a phase-shift element for shifting a phase of the input signal relative to a phase of the periodic signal by a phase shift value, wherein the state change is sensed at a point in time determined by the timing of the predefined edge; and a detection element for detecting the timing of the edge of the input signal relative to the timing of the predefined edge based on the phase shift value, wherein the phase-shift element is an adjustable digital delay element for delaying the input signal by an adjustable delay value as the phase shift value, wherein the delay element adjusts the delay value by controlling the delay value in discrete steps, and wherein the phase-shift element shifts the phase of the input signal in a number of discrete steps, each of which has a predefined delay value per step as the phase shift value, until the state change is detectable at a point in time defined by the timing of the predefined edge of the periodic signal.

3. The device according to 1, further comprising a control element that adjusts the delay value of the delay element as a function of an output signal of the detection element, when an output signal of the detection element indicates that no state change is present.

4. The device according to claim 3, wherein the control element determines and outputs the delay value based on the controlled discrete steps as the detected timing of the edge of the input signal relative to the timing of the predefined edge of the periodic signal.

5. The device according to claim 1, further comprising a timer that, in response to a control signal from a control element, outputs a timer signal having a timer signal edge that defines the state change between a first and a second state of the timer signal, wherein the control element repeats the control signal and changes the delay value with each repetition until a phase zero-crossing is detected by the detection element as a termination condition.

6. The device according to claim 5, further comprising an analysis element for detecting a characteristic of the timer based on a series of phase shift values as a function of timings.

7. The device according to claim 1, wherein a difference in the timing of the edge and the predefined edge is less than a period of the periodic signal.

8. A measurement method for detecting a characteristic of a timer that, in response to a control signal indicating a timing of an edge of an output signal of the timer relative to a timing of a predefined edge of a periodic signal, outputs a another timer signal having a timer signal edge that defines a state change between a first and a second state of the timer signal, the method comprising:

generating a first control signal and a second control signal, the first control signal indicating a first edge of a timer output with a first timing relative to a timing of a predefined edge of a periodic signal, and the second control signal indicating a second edge of the timer output with a second timing relative to a timing of a predefined edge of the periodic signal;

shifting a phase of a first timer signal with a first timer signal edge relative to the phase of the periodic signal by a first phase shift value by adjusting a first delay value of a digital delay element for which the state change is detected at a point in time determined by the timing of the predefined edge;

shifting a phase of a second timer signal with a second timer signal edge, which is delayed relative to the phase of the periodic signal, by a second phase shift value by adjusting a second delay value of a delay element for which the state change is detected at a point in time determined by the timing of the predefined edge;

detecting the timing of the first timer signal edge based on the first delay value as the phase shift value;

detecting the timing of the second timer signal edge based on the second delay value as the phase shift value; and detecting a characteristic based on a series of phase shift values as a function of the timing of the first and second timer signal edges.

* * * * *